United States Patent
Gowda et al.

(10) Patent No.: US 6,275,259 B1
(45) Date of Patent: Aug. 14, 2001

(54) DIGITAL AUTOMATIC GAIN CONTROL CIRCUIT FOR IMAGE SYSTEM

(75) Inventors: Sudhir Muniswamy Gowda, Ossining, NY (US); Hyun Jong Shin, Ridgefield, CT (US); Hon-Sum Philip Wong, Chappaqua, NY (US); Peter Hong Xiao, San Jose, CA (US); Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/017,094

(22) Filed: Feb. 2, 1998

(51) Int. Cl.[7] .............................. H04N 5/235; G03B 7/00; H03M 1/62
(52) U.S. Cl. ........................ 348/229; 348/230; 348/362; 348/673; 341/138; 341/139
(58) Field of Search .................................... 348/229, 230, 348/362; 341/138, 139, 143

(56) References Cited

U.S. PATENT DOCUMENTS

| | | |
|---|---|---|
| 3,872,434 | 3/1975 | Duvall et al. . |
| 4,157,533 | 6/1979 | DuVall . |
| 4,403,253 | 9/1983 | Morris et al. . |
| 4,439,756 * | 3/1984 | Shenoi et al. ........................ 341/143 |
| 4,540,974 | 9/1985 | Schanne et al. . |
| 4,642,694 * | 2/1987 | Yamagishi et al. .................. 348/673 |
| 4,799,106 | 1/1989 | Moore et al. . |
| 4,989,074 | 1/1991 | Matsumoto . |
| 5,012,245 * | 4/1991 | Scott et al. ........................... 341/144 |
| 5,048,054 * | 9/1991 | Eyuboglu et al. .................... 375/222 |
| 5,087,914 * | 2/1992 | Sooch et al. ......................... 341/120 |
| 5,245,344 * | 9/1993 | Sooch .................................. 341/143 |
| 5,343,200 | 8/1994 | Matsui . |
| 5,548,253 * | 8/1996 | Durrant ................................ 332/103 |
| 5,574,756 * | 11/1996 | Jeong .................................. 327/149 |

FOREIGN PATENT DOCUMENTS

| | | |
|---|---|---|
| 4301968 | 10/1992 | (JP) . |
| 5244006 | 9/1993 | (JP) . |
| 07177033 | 7/1995 | (JP) . |
| 8008745 | 1/1996 | (JP) . |
| 08293794 | 11/1996 | (JP) . |
| 8340255 | 12/1996 | (JP) . |

* cited by examiner

Primary Examiner—Wendy R. Garber
Assistant Examiner—Rashawn N. Tillery
(74) Attorney, Agent, or Firm—F. Chau & Associates, LLP

(57) ABSTRACT

The present invention relates to an automatic gain control circuit in which the automatic gain control function is performed entirely in the digital domain. In an illustrative embodiment, the digital automatic gain control circuit for an image sensor having associated therewith an analog-to-digital (A/D) converter for converting analog electrical signals from the image sensor to corresponding digital codes, includes a min/max detector for determining minimum and maximum electrical signal values from the digital codes of the A/D converter for each frame of image. A filter coupled to the min/max detector dampens instantaneous changes of the minimum and maximum values by filtering to provide filtered minimum and maximum values. A digital-to-analog (D/A) converter coupled to the filter generates minimum and maximum analog reference voltages corresponding to the respective minimum and maximum filtered values, the reference voltages being applied to the A/D converter to control associated amplitudes of the digital codes provided thereby.

24 Claims, 2 Drawing Sheets

DIGITAL AUTOMATIC GAIN CONTROL CIRCUIT FOR IMAGE SYSTEM

BACKGROUND OF THE INVENTION

1. Field of the Invention

This invention relates to automatic gain control circuits. More specifically, the present invention relates to apparatus and methods for digital automatic gain control for image systems.

2. Description of the Prior Art

Due to the advent of multimedia communications, the need has arisen for low-cost solid state imagers to complement communication devices and computers. The image input device is an integral part of any teleconferencing and multimedia application. An important advantage of complementary metal-oxide semiconductor (CMOS) image sensors is that signal processing circuits can be readily integrated on the same chip as the imager, thus enabling the design of smart single-chip camera systems. CMOS imagers are inherently lower cost than conventional charge-coupled devices (CCDs) because the CMOS imagers can be manufactured in conventional, widespread CMOS fabrication lines without any process modification.

Present day electronic cameras employ automatic gain control (AGC) circuits that dynamically adjust the amplification gain (i.e., dynamic range) of the light-induced electrical signal so that a relatively "dark" picture appears "bright" to the user. The automatic gain control circuits are implemented with analog circuits because the light-induced electrical signal is analog. With a CMOS imager sensor, it is possible to incorporate the analog-to-digital conversion function on the same chip as the image sensor. Accordingly, the light-induced electrical signal can be converted into the corresponding digital signal early in the signal processing chain. This technique is disclosed in co-pending U.S. patent application Ser. No. 08/876,694, entitled "Image Sensor with Direct Digital Correlated Double Sampling", filed on Jun. 12, 1997, assigned to the assignee herein, incorporated by reference herein. Therefore, it is desirable to implement automatic gain control circuits using entirely digital means. It is to be appreciated that eliminating analog circuits from the system will make circuit design easier, and more compatible with conventional digital CMOS fabrication technologies.

SUMMARY OF THE INVENTION

The present invention relates to apparatus and methods for automatic gain control in which the automatic gain control function is performed entirely in the digital domain. In an illustrative embodiment, the digital automatic gain control circuit for an image sensor having associated therewith an analog-to digital converter (ADC) for converting analog electrical signals from the image sensor to corresponding digital codes, includes a min/max detector for determining minimum and maximum electrical signal values from the digital codes of the ADC for each frame of image. A digital filter, e.g., a low pass filter, is coupled to the min/max detector and dampens instantaneous changes of the minimum and maximum values to provide filtered minimum and maximum values. A digital-to-analog converter DAC coupled to the filter generates minimum and maximum analog reference voltages corresponding to the respective minimum and maximum filtered values, the reference voltages being applied to the ADC to control associated amplitudes of the digital codes provided thereby.

Optionally, the image sensor may be a CMOS sensor with ADC circuitry disposed in proximity to the image sensor array. Also, an analog low pass filter may be employed between the DAC and the ADC to further dampen instantaneous changes of the reference voltages. Additionally, the MIN/MAX detector may have encoded therein algorithms. The functions embodied in the algorithms may include averaging (low pass filtering) and/or detection and correction of excessively high or low maximum and minimum electrical signal values, respectively. Specifically, if excessively high or low signal values are detected, the MIN/MAX detector provides special codes to the DAC to increment or decrement the reference voltages supplied to the ADC in order to influence the instantaneous change in the reference voltages supplied to the ADC.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, wherein.

DETAILED DESCRIPTION OF PREFERRED EMBODIMENTS

Figure 1:
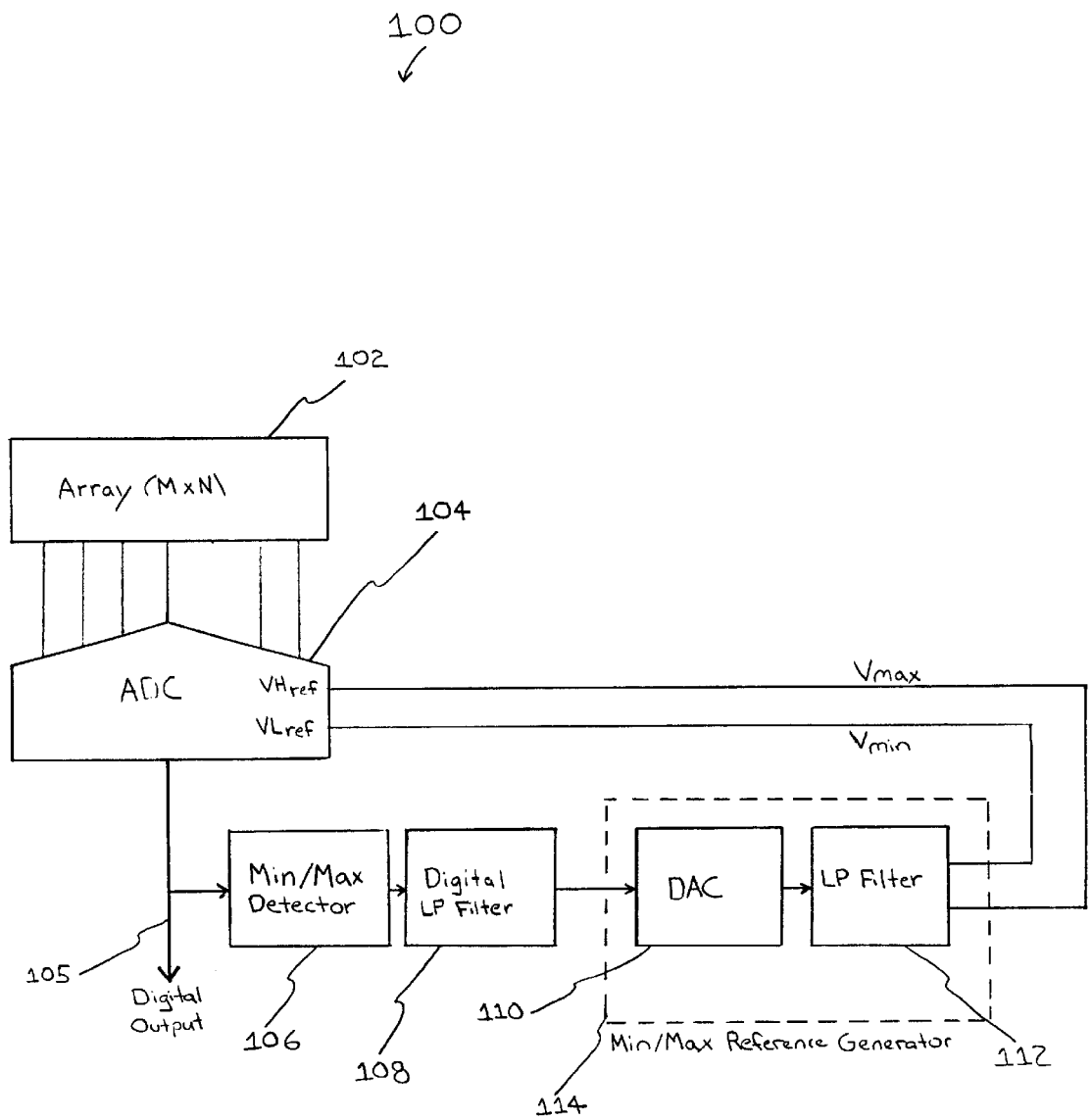
FIG. 1 is a block diagram of an embodiment of the present invention.

Referring to FIG. 1, there is shown an embodiment 100 of an image sensor including digital automatic gain control circuitry in accordance with this invention. An image sensor 102 having an array of pixels (M rows×N columns) 102 provides analog electrical signal outputs, where each is indicative of an amount of light incident upon one of the pixels at a given time. The electrical signals are fed to an analog-to-digital converter (ADC) 104 which converts them to corresponding digital values in accordance with upper ($VH_{ref}$) and lower ($VL_{ref}$) reference voltages. Although the illustrative embodiment of the present invention shows one ADC for the one image sensor chip, those skilled in the art will appreciate that the same function can be performed using any ADC architecture such as, for example, one ADC per column, one ADC per pixel, several ADC per column, or several ADC per pixel. Thus, the invention is not limited to any particular ADC architecture.

The digital values from ADC 104 are outputted for further processing or for viewing on a display via digital output line 105. The digital values from ADC 104 are also fed into a MIN/MAX detector 106 which determines the minimum and maximum values for each frame of an image. MIN/MAX detector 106 can be, for example, a logic circuit with read-only memory (ROM), programmable using an electrically erasable programmable read-only memory (EEPROM), or dynamically loaded upon power-up. The initial values of $VH_{ref}$ and $VL_{ref}$ are determined by the circuit design of the image sensor signal chain. As an example, using a 3.3 VDC power supply, the initial output values of the image sensor and thus, the boundaries of $VL_{ref}$ and $VH_{ref}$, will be approximately 0.5 to 1.0 VDC. In any case, the reference voltages will be limited by the power supply voltage range.

The minimum and maximum values from MIN/MAX detector 106 are then passed through a digital low pass filter 108 to dampen the instantaneous change of the min/max values. In practice, digital low pass filter 108 can be implemented using a simple averaging circuit that averages the min/max values for the previous m frames. In the alternative, more sophisticated digital low pass filtering techniques can be used. In any case, the averaged maximum digital value is converted into a corresponding analog signal $V_{max}$ by a digital-to-analog converter (DAC) 110 and this analog $V_{max}$ value is fed back to ADC 104 as the upper reference value $Vh_{ref}$. Also, the averaged minimum digital value is converted into a corresponding analog signal $V_{min}$ and this analog value is fed back to ADC 104 as the lower reference value $VL_{ref}$.

The output of DAC 110 may also pass through an additional low-pass filter 112 which is optional. The DAC 110 and optional low-pass filter 112 together form the Min/Max reference generator circuit 114. The analog values $V_{max}$ and $V_{min}$ define the actual maximum and minimum analog reference voltages supplied to ADC 104 for conversion corresponding to $VH_{ref}$ and $VL_{ref}$, respectively. VHH is the maximum possible value for the upper reference voltage $VH_{ref}$ accepted by ADC 104. Likewise, VLL is the smallest possible value for the lower reference voltage $VL_{ref}$ accepted by ADC 104.

Figure 2:
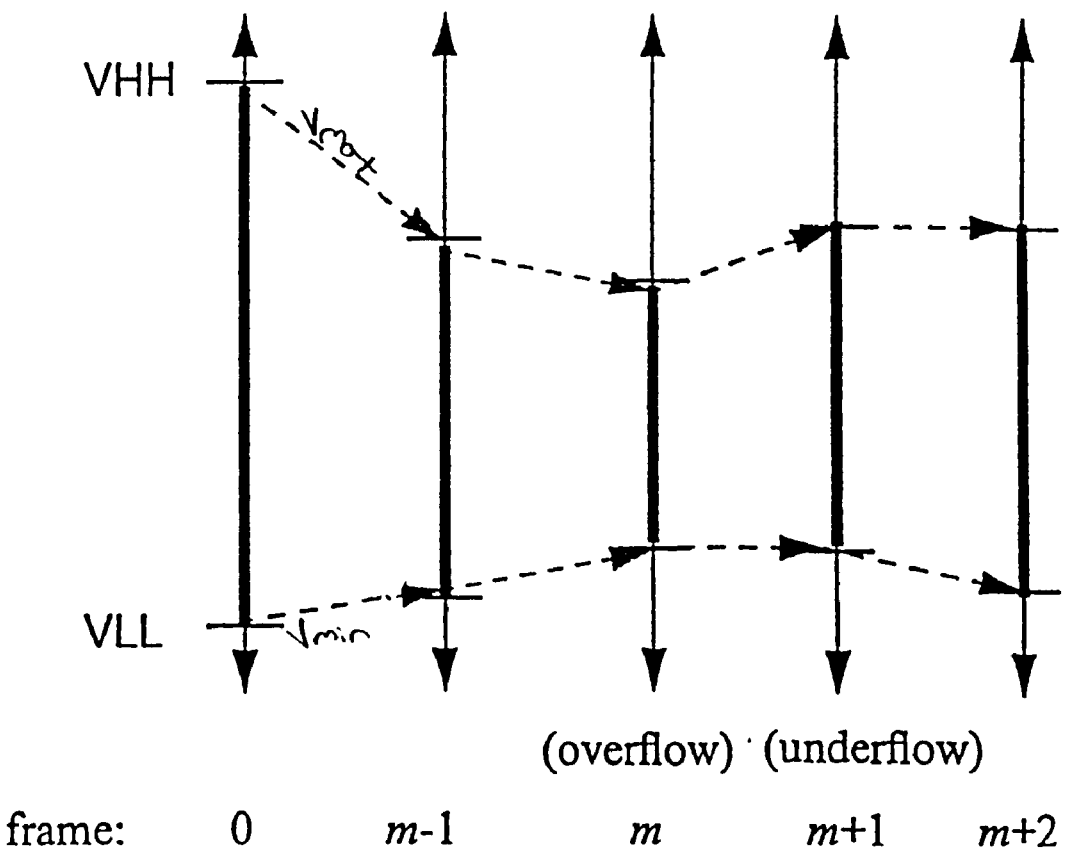
FIG. 2 is a diagram showing the refreshing of the reference voltages over several frames according to an embodiment of the present invention.

FIG. 2 is a diagram showing the refreshing of the reference voltages ($V_{max}$ and $V_{min}$) over several frames. When the image sensor is capturing video signal (continuous image frames at a fixed frame rate), the refreshed reference voltage range ($V_{max}$ to $V_{min}$) for the current frame is provided to ADC 104 for the next frame conversion. Thus, the digital automatic gain control (AGC) circuit of the present invention performs automatic contrast control by gradually (frame to frame) adjusting the brightness of the frames and dynamically adjusting the dynamic range of the frames. In the example of FIG. 2, the $V_{min}$ and $V_{max}$ window is collapsing between frames 0 to m, and is expanding between frames m to m+2.

In order to use the full dynamic range of the ADC 104, a percentage of the digital codes outputted therefrom should be all digital 1s (e.g., 11111111 for an 8 bit digital word) as well as all digital zeros (e.g., 00000000). If none of the output codes equal all 1s or all 0s, then the full dynamic range of the ADC 104 is not being used. Conversely, if too many all 1s and all 0s are being outputted from the ADC 104, then the ADC is being saturated. However, for the circuits considered here, buffer ranges in the high band and the low band are utilized. Thus, to detect OVERFLOW and UNDERFLOW conditions, as defined below, sets of digital high and low values are defined. For example, the set of digital high values (i.e., buffer range) may be from 11111100 to 11111111 and the set of digital low values may be from 00000000 to 00000011.

For the case where the $V_{min}$ and $V_{max}$ window is expanding, ADC 104 will detect an OVERFLOW or UNDERFLOW condition. An overflow condition corresponds to the case in which the analog signal outputted from the image sensor 102 to ADC 104 for converting is greater than the ADC 104 reference voltage $V_{max}$, resulting in an output from ADC 104 in the high range (i.e., 11111100 to 11111111). In contrast, an underflow condition corresponds to the case in which the analog signal outputted from the image sensor 102 to ADC 104 for converting is less than the ADC 104 reference voltage $V_{min}$, resulting in an output from ADC 104 in the low range (i.e., 00000000 to 00000011). When either of these conditions occur, MIN/MAX detector 106 will provide a special code to DAC 110 to increment or decrement $V_{max}$ and $V_{min}$, so that $V_{max}$ and $V_{min}$ will gradually move towards VHH and VLL, respectively, until the OVERFLOW or UNDERFLOW condition no longer exists. Ideally, if the reference voltage range is from VHH to VLL ($VH_{ref}$ to $VL_{ref}$), the full dynamic range of the ADC is used for the available signal range. The amount by which the reference voltages move toward their respective maximum (VHH) or minimum (VLL) values can be set by algorithms implemented in the MIN/MAX detector.

For the case where the $V_{min}$ and $V_{max}$ window is collapsing, MIN/MAX detector 106 will increment or decrement $V_{max}$ and $V_{min}$ until an UNDERFLOW or OVERFLOW condition exists. Then, $V_{max}$ and $_{max}$ will be adjusted (incremented/decremented) so that $V_{max}$ and $V_{min}$ will gradually move towards VHH and VLL, respectively, until the OVERFLOW or UNDERFLOW condition no longer exists.

For still picture capture one needs to take two frames of image. The first frame (m=1) determines the $V_{min}$ and $V_{max}$ to be used by ADC 104 as the reference value for the following frame (m=2). This assumes that the object scene to be captured does not change between the time the first frame was taken and the capture of the following frame (typically within 1/60 second). The capture of the first frame which sets the ADC reference voltages is similar to light metering in conventional film cameras.

It is to be appreciated that the automatic gain control circuit of the present invention provides a reduction in required chip area and complexity by eliminating the use of large area capacitors in the analog low pass filters of prior art devices. Furthermore, in contrast to the conventional method of automatic gain control where the analog AGC circuit is hardwired into the circuit design, the present invention allows for the use of algorithms implemented in digital circuitry for the automatic gain control function. The algorithms are encoded in the digital MIN/MAX detector and may be changed dynamically or set at the factory. The present invention may be used for imaging systems utilizing a charged-coupled device (CCD), a complementary metal-oxide semiconductor (CMOS) image sensor, a charge-injection device (CID), and hybrids thereof. However, in the case where the image sensor outputs a digital signal, the use of an analog AGC circuit requires an additional step (with an associated increase in manufacturing expense and circuit area) of digital-to-analog conversion. Accordingly, the invention provides an AGC circuit better suited for use with imagers providing digitized signal outputs such as the imagers disclosed in the following co-pending U.S. Patent Applications: Ser. No. 08/876,694, entitled "Image Sensor with Direct Digital Correlated Double Sampling", filed on Jun. 12, 1997; Ser. No. 08/873,537, entitled "Correlated Double Sampling with Up/Down Counter", filed on Jun. 12, 1997; and Ser. No. 08/873,539, entitled "Image Sensor with Dummy Pixel or Dummy Pixel Array", filed on Jun. 12, 1997, all of which are assigned to the assignee herein, and incorporated by reference herein.

Correlated double sampling refers to the situation where two signals are sampled and one is subtracted from the other to remove noise, offset or other errors from the data. When used in CMOS image sensors, a reset level is subtracted from a signal level and the correlated double sampling technique effectively removes the fixed pattern noise of the image sensor arising from the offset errors due to transistor mismatches in manufacturing. Prior art CMOS image sensors typically utilize a pair of analog capacitors to store reset and signal samples. However, the analog capacitors add noise to the signal samples, thus diminishing image data accuracy.

A technique of improving the image data accuracy relative to the analog approach is to perform correlated digital sampling entirely in the digital domain, as described in co-pending patent application Ser. No. 08/1875,694, entitled "Image Sensor with Direct Digital Correlated Double Sampling", mentioned above. In that application, an embodiment is described in which an ADC is connected directly to each column data line at the bottom of each column for a typical image sensor configuration having a plurality of image cells arranged in rows and columns. The ADC directly converts the reset sample on the column data line to a first digital codeword and outputs the codeword to a register for temporary storage. The register transfers the first codeword to signal processing circuitry for a subsequent operation. The ADC then converts the signal sample to a second codeword, where the level of the signal sample relative to the reset level corresponds to the amount of light incident upon the pixel. The second digital sample is then transferred to the register for subsequent transfer to the signal processing circuitry. The signal processing circuitry subtracts the rest level from the signal level (or vice versa) to obtain an image datum with the reset level and associated noise removed. As applied to the present invention, $V_{min}$ and $V_{max}$ are the lowest and highest analog values, respectively, plus some margin. Accordingly, $V_{min}$ corresponds to the reset level.

A further improvement on the above described technique reduces the on-chip circuitry required to implement the correlated double sampling. This technique is disclosed in co-pending U.S. patent application Ser. No. 08/873,537, entitled "Correlated Double Sampling With Up/Down Counter", filed on Jun. 12, 1997, assigned to the assignee herein, incorporated by reference herein. In that application, the subtraction of the reset sample from the signal sample is performed automatically in the ADC(s), thus eliminating the need for the signal processor to perform the subtraction operation. The up/down counter performs the digital subtraction function without an adder and does not impact the analog values. As applied to the present invention, $V_{min}$ and $V_{max}$ correspond to the lowest and highest analog values, respectively. More particularly, $V_{min}$ corresponds to the reset level which is provided to the MIN/MAX detector 106 before subtraction by the up/down counter.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital automatic gain control circuit for an image system having associated therewith an analog-to digital (A/D) converter for converting analog electrical signals from the image system to corresponding digital codes, said circuit comprising:
   determining means for determining minimum and maximum electrical signal values from the digital codes of the A/D converter;
   a digital filter coupled to said determining means for dampening instantaneous changes of the minimum and maximum values to provide filtered minimum and maximum values; and
   a min/max reference generator coupled between said filter and the A/D converter for generating minimum and maximum analog reference voltages corresponding to the respective minimum and maximum filtered values, said reference voltages being applied to the A/D converter to control associated amplitudes of the digital codes provided thereby.

2. The circuit of claim 1, wherein said min/max reference generator comprises a digital-to-analog (D/A) converter.

3. The circuit of claim 2, wherein said min/max reference generator further comprises an additional filter coupled between said D/A converter and the A/D converter for dampening of instantaneous changes of the reference voltages by filtering to provide filtered minimum and maximum analog reference voltages to the A/D converter.

4. The circuit of claim 1, wherein said determining means is a min/max detector and said digital filter is a low pass filter.

5. The circuit of claim 1, wherein said determining means provides an output code to said min/max reference generator indicating that a maximum analog electrical signal from the image system is greater than the maximum analog reference voltage from said min/max reference generator, said min/max reference generator being responsive to said output code to adjust the maximum analog reference voltage to the A/D converter.

6. The circuit of claim 5, wherein said determining means utilizes an algorithm to determine the adjustment of the maximum analog reference voltage to the A/D and provides the determination to said min/max reference generator in the code.

7. The circuit of claim 1, wherein said determining means provides an output code to said min/max reference generator indicating that a minimum analog electrical signal from the image system is less than the minimum analog reference voltage from said min/max reference generator, said min/max reference generator being responsive to said output code to adjust the minimum analog reference voltage to the A/D converter.

8. The circuit of claim 7, wherein said determining means utilizes an algorithm to determine the adjustment of the minimum analog reference voltage to the A/D and provides the determination to said min/max reference generator in the code.

9. The circuit of claim 1, wherein said filter is an averaging circuit that averages minimum and maximum values for a predetermined number of frames.

10. The circuit of claim 1, wherein the image system is selected from the group consisting of a charged-coupled device (CCD), a complementary metal-oxide semiconductor (CMOS) image sensor, a charge-injection device (CID), and hybrids thereof.

11. The circuit of claim 1, wherein the minimum and maximum electrical signal values determined by the determining means correspond to a frame of image.

12. A digital automatic gain control circuit for a complementary metal-oxide semiconductor (CMOS) image sensor having associated therewith an analog-to digital (A/D) converter for converting analog electrical signals from the CMOS image sensor to corresponding digital codes, said circuit comprising:
   determining means for determining minimum and maximum electrical signal values from the digital codes of the A/D converter for each frame of image;
   a filter coupled to said determining means for dampening instantaneous changes of the minimum and maximum values by filtering to provide filtered minimum and maximum values; and
   a digital-to-analog (D/A) converter coupled to said filter for generating minimum and maximum analog reference voltages corresponding to the respective minimum and maximum filtered values, said reference voltages being applied to the A/D converter to control associated amplitudes of the digital codes provided thereby.

13. The circuit of claim 12, wherein said filtering by said filter comprises averaging the minimum and maximum values for a predetermined number of previous frames of image.

14. The circuit of claim 12, wherein said determining means is a min/max detector.

15. The circuit of claim 12, further comprising a subsequent filter coupled between said D/A converter and the A/D converter for dampening of instantaneous changes of the reference voltages by filtering to provide filtered minimum and maximum analog reference voltages to the A/D converter.

16. The circuit of claim 12, wherein said determining means provides an output code to said D/A converter indicating that a maximum analog electrical signal from the image sensor is greater than the maximum analog reference voltage from said D/A converter, said D/A converter being responsive to said output code to adjust the maximum analog reference voltage to the A/D converter.

17. The circuit of claim 16, wherein said determining means utilizes an algorithm to determine the adjustment of the maximum analog reference voltage to the A/D and provides the determination to said D/A converter in the code.

18. The circuit of claim 12, wherein said determining means provides an output code to said D/A converter indicating that a minimum analog electrical signal from the image sensor is less than the minimum analog reference voltage from said D/A converter, said D/A converter being responsive to said output code to adjust the minimum analog reference voltage to the A/D converter.

19. The circuit of claim 18, wherein said determining means utilizes an algorithm to determine the adjustment of the minimum analog reference voltage to the A/D and provides the determination to said D/A converter in the code.

20. The circuit of claim 12, wherein two frames of image are captured for still pictures, the first frame determining the $V_{min}$ and $V_{max}$ to be used by the A/D converter as the reference values for the following frame.

21. The circuit of claim 20, wherein the two frames of image are captured within one sixtieth of a second of each other.

22. A method for performing digital automatic gain control for a complementary metal-oxide semiconductor (CMOS) image sensor having associated therewith an analog-to digital (A/D) converter for converting analog electrical signals from the CMOS image sensor to corresponding digital codes, said method comprising:

determining minimum and maximum electrical signal values from the digital codes of the A/D converter for each frame of image;

dampening instantaneous changes of the minimum and maximum values to provide filtered minimum and maximum values;

generating minimum and maximum analog reference voltages corresponding to the respective minimum and maximum filtered values; and applying said reference voltages to the A/D converter to control values of the digital codes provided thereby.

23. The method of claim 22, wherein said dampening step comprises averaging the minimum and maximum values for a predetermined number of previous frames of image.

24. The method of claim 22, further comprising subsequent dampening of instantaneous changes of the reference voltages by filtering to provide filtered minimum and maximum analog reference voltages to the A/D converter.

* * * * *